(12) United States Patent
Seidl et al.

(10) Patent No.: US 10,765,043 B2
(45) Date of Patent: Sep. 1, 2020

(54) HEAT EXCHANGER FOR AN ELECTRICAL COMPONENT IN A MOTOR VEHICLE AND PRODUCTION METHOD

(71) Applicant: Lisa Draexlmaier GmbH, Vilsbiburg (DE)

(72) Inventors: Stefan Seidl, Landshut (DE); Bernhard Wallner, Velden (DE); Guido Hofer, Weng (DE); Stefan Deser, Landshut (DE); Michael Horak, Tuessling (DE); Alexander Hahn, Roettenbach (DE); Alexander Berg, Altoetting (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 686 days.

(21) Appl. No.: 15/393,742

(22) Filed: Dec. 29, 2016

(65) Prior Publication Data

US 2017/0196127 A1    Jul. 6, 2017

(30) Foreign Application Priority Data

Jan. 4, 2016  (DE) .................... 10 2016 100 080

(51) Int. Cl.
  *F28F 21/06* (2006.01)
  *H05K 7/20* (2006.01)
  (Continued)

(52) U.S. Cl.
  CPC ......... *H05K 7/20927* (2013.01); *F28F 1/022* (2013.01); *F28F 9/0221* (2013.01);
  (Continued)

(58) Field of Classification Search
  CPC .. F28F 9/02; F28F 9/162; F28F 9/0258; F28F 21/06; F28F 21/067; F16L 13/10; H05K 7/20927
  See application file for complete search history.

(56) References Cited

U.S. PATENT DOCUMENTS 5,228,724 A * 7/1993 Godeau ................. F16L 37/098
                                                             285/319
5,685,577 A * 11/1997 Vanesky ............. B29C 66/5221
                                                             156/295
(Continued)

FOREIGN PATENT DOCUMENTS

DE    10 2008 027 293 A1    10/2009
EP     2 654 120 A1          10/2013
(Continued)

OTHER PUBLICATIONS

Office Action in German Application No. DE 10 2016 100 080.9, dated Oct. 11, 2016.

*Primary Examiner* — Eric S Ruppert
(74) *Attorney, Agent, or Firm* — Jacob Eisenberg

(57) ABSTRACT

Embodiments disclose a flexible connection of a metallic extruded profile to a connecting body for cooling electrical components. A heat exchanger for an electrical component comprises a metallic extruded profile having at least one channel for a cooling agent to flow through, the metallic extruded profile including an outer circumferential surface and a first end, a non-metallic connecting body including an accommodating region for receiving the first end of the metallic extruded profile at a first opening corresponding to a cross-section of the first end, the first opening having an inner circumferential surface, and a bonding layer between the outer circumferential surface of the first end received in the accommodating region and the inner circumferential surface of the opening. The bonding layer is configured to establish a mechanically flexible bond between the metallic extruded profile and the non-metallic connecting body. Embodiments further disclose a production method for a heat exchanger.

16 Claims, 7 Drawing Sheets

(51) Int. Cl.
*F28F 1/02* (2006.01)
*F28F 21/08* (2006.01)
*H01M 10/60* (2014.01)
*F28F 9/02* (2006.01)

(52) U.S. Cl.
CPC .......... *F28F 21/067* (2013.01); *F28F 21/081* (2013.01); *H01M 10/60* (2015.04); *H05K 7/20254* (2013.01); *F28F 2230/00* (2013.01); *F28F 2255/16* (2013.01); *F28F 2275/08* (2013.01)

(56) References Cited

U.S. PATENT DOCUMENTS

| | | |
|---|---|---|
| 5,799,986 A | 9/1998 | Corbett et al. |
| 2002/0148599 A1* | 10/2002 | Kaemmler ............... F01P 11/04 165/133 |
| 2011/0132580 A1 | 6/2011 | Herrmann et al. |
| 2011/0169263 A1* | 7/2011 | Bazika .................. B29C 66/919 285/293.1 |
| 2014/0322571 A1* | 10/2014 | Fabian ................ H01M 10/625 429/82 |
| 2015/0171486 A1* | 6/2015 | Rawlinson .......... H01M 10/482 324/426 |

FOREIGN PATENT DOCUMENTS

| | | | |
|---|---|---|---|
| EP | 2 804 251 A1 | 11/2014 | |
| WO | WO-2005116415 A1 * | 12/2005 | .......... F02B 29/0418 |

\* cited by examiner

HEAT EXCHANGER FOR AN ELECTRICAL COMPONENT IN A MOTOR VEHICLE AND PRODUCTION METHOD

CROSS REFERENCE TO RELATED APPLICATION

This application is based upon and claims the benefit of prior German Patent Application No. 10 2016 100 080.9, filed on Jan. 4, 2016, the entire contents of which are incorporated herein by reference.

TECHNICAL FIELD

The present disclosure relates to a heat exchanger for an electrical component in a motor vehicle, and to a production method for a heat exchanger for an electrical component in a motor vehicle. The electrical component may be a battery or power electronics in a motor vehicle.

BACKGROUND

Current vehicle construction includes a rising number of electrical components. This holds true not only in the area of electro mobility, where the entire drive train of a vehicle is electrically powered, but also for vehicles comprising conventional engines and in the commercial vehicle field. This generally requires electric energy to be stored in batteries or rechargeable batteries. High currents originating from these components or also flowing through other electrical or electronic components frequently necessitate cooling of the components. Cooling is usually carried out by way of air or fluids conducted through structures that mechanically nestle closely against the parts heated by the flow of current. These structures are typically made of metal to ensure good heat transfer. To keep costs low, extruded profiles made of different metallic materials may be used for the structure. Joining elements are necessary at the respective ends of such metallic extruded profiles. Typically, these joining elements are fixedly attached to these extruded profiles. The resulting stresses caused by temperature changes, differing coefficients of thermal expansion, vibrations, oscillations and the like propagate throughout the entire cooling or battery system.

SUMMARY

According to embodiments of the present disclosure, a hollow profile is connected to a connecting body for cooling applications for electrical components. The resulting connection provides a lower weight and a simpler manufacturing process.

According to embodiments of the present disclosure, a method is disclosed for connecting a connecting body in a flexible and mechanically resilient manner to a flat hollow profile made of a material having good thermal conductivity for use in cooling applications for electrical components. The connecting body is hollow inside and composed of a non-metallic injection-molded part. The connecting body has a first opening corresponding to a cross-section of one end of the flat metallic hollow profile to be accommodated. When connected, the opening peripherally around the flat metallic hollow profile is larger than the flat metallic hollow profile by a distance. The space between an outer wall of the flat metallic hollow profile and an inner side of the connecting body in the region of the first opening is filled by a mechanically flexible component, creating a connection between the inside of the connecting body and the metallic hollow profile.

According to embodiments of the present disclosure, a heat exchanger for an electrical component in a motor vehicle is disclosed, the heat exchanger comprising a metallic extruded profile having at least one channel for a cooling agent to flow through, the metallic extruded profile having an outer circumferential surface and a first end; a non-metallic connecting body including an accommodating region for receiving the first end of the metallic extruded profile at a first opening corresponding to a cross-section of the first end, the first opening having an inner circumferential surface; and a bonding layer between the outer circumferential surface of the first end received in the accommodating region and the inner circumferential surface of the opening, wherein the bonding layer is configured to establish a mechanically flexible bond between the metallic extruded profile and the non-metallic connecting body.

According to embodiments of the present disclosure, a method for producing a heat exchanger for an electrical component in a motor vehicle is disclosed, the method comprising providing a metallic extruded profile having at least one channel for a cooling agent to flow through, the metallic extruded profile having an outer circumferential surface and a first end, and a non-metallic connecting body including an accommodating region for receiving the first end of the metallic extruded profile at a first opening corresponding to a cross-section of the first end, the first opening having an inner circumferential surface; inserting the first end of the metallic extruded profile into the first opening of the connecting body; and creating a bonding layer between the outer circumferential surface of the first end received in the accommodating region and the inner circumferential surface of the opening, wherein the bonding layer is configured to establish a mechanically flexible bond between the metallic extruded profile and the non-metallic connecting body.

According to embodiments of the present disclosure, the connecting body may be an extruded profile through which a cooling medium or cooling agent can flow and functions as a heat sink. The mechanically flexible component forms a bonding layer between the connecting body (i.e. the extruded profile) and the non-metallic connecting body (i.e. the injection-molded part).

According to embodiments of the present disclosure, an additional seal or shield may be provided in the opening of the connecting body.

In embodiments of the present disclosure, for the bonding layer to better connect to the connecting body, the connecting body is optionally surface-treated. The connecting body may be cleaned and/or treated with plasma and/or coated with a primer.

In embodiments of the present disclosure, for the bonding layer to better connect to the hollow profile, the hollow profile is surface-treated. The hollow profile may be cleaned and/or treated with plasma and/or coated with a primer and/or etched.

In embodiments of the present disclosure, surface treatment is carried out to promote adhesion between the treated surfaces and the bonding layer. During a plasma treatment or corona treatment, the surface is chemically activated.

In embodiments of the present disclosure, the connecting process may be followed by a thermal process or irradiation, for example using UV light, so as to cross-link and/or cure the bonding layer.

In embodiments of the present disclosure, instead of cooling, the finished component can also have a heating function if the liquid in the metallic hollow profile has a temperature that is higher than the ambient temperature. This may be useful, for example, for batteries in a cold environment.

In embodiments of the present disclosure, the connecting body is suitable for joining or terminating cooling conduits of different types, for example cooling conduits used in electro mobility. For example, these include batteries, DC/DC converters or other power components that require special cooling. Profiled metal pipes, for example flat metal conduits, which may be provided with transverse ribs on the inside, can be cost-effectively and efficiently joined in a multifaceted manner to the flexibly connected connecting body according to the present disclosure. This may involve corner joints or those that require joints to other connection forms such as hose connectors or connections for vent lines.

In embodiments of the present disclosure, additional sensors can be mounted in or on the connecting bodies. An installation of sensors in the isolating connecting body can be achieved without having to provide complex bores in the metal profiles or other metallic connecting bodies. The sensors may also have an electrical isolation with respect to the metallic hollow profiles.

In embodiments of the present disclosure, the bonding layer provides a highly resilient mechanical bond between the connecting body and the metallic hollow profile, and also provides elasticity with respect to mechanical stresses, vibrations, differing thermal expansion levels and the like. It provides a simpler process that is more cost-effective. The bonding layer may be resistant to the fluid medium. Being able to select between a sealing compound, an injection molding material or an adhesive as the bonding layer allows different usage options or processing forms.

In embodiments of the present disclosure, the material of the connecting body is a non-metallic material. Essentially thermoplastic polymer types, such as polyamide (PA) and polybutylene terephthalate (PBT), are possible materials, which can be used to produce dimensionally stable hollow bodies using the injection molding process. Moreover, fiber composite materials such as carbon fiber reinforced polymer material (CFRP) or glass fiber reinforced composite materials (GFRP) can be used, which generally have a higher basic strength. This may also enable producing cooling systems having a higher operating pressure for the coolant. The fiber density may have differing levels in different regions of the connecting body so as to render only those regions that are exposed to higher mechanical loads (such as the opening regions) more stable. A production process using the injection molding technique may be more cost-effective than producing the connecting body from metal, both in terms of the material and the manufacturing process per se.

In embodiments of the present disclosure, at least one guide profile, for example at least one insertion aid narrowing toward the inside of the connecting body, may extend inside the opening up to a stop, the stop configured to provide an end point within the first opening when receiving the first end of the metallic extruded profile. The guide profile may be located on an inner upper side and an inner lower side of the connecting body to simplify an insertion of the metallic hollow profile into the connecting body. Furthermore, reinforcing ribs and/or spacers may selectively be provided inside the opening of the connecting body. Spacers can implement a joining gap having a defined distance between the extruded profile and the connecting body, so as to set a minimum thickness for the bonding layer, for example when this is introduced after the two components have been correctly arranged. This may aid in automated assembly, for example. Simple duct-like guide profiles perpendicularly to the delimitation of the opening, or a guide profile that extends across a larger region of the first opening, are conceivable. In addition, the guide profile or profiles may also be used to increase the mechanical stability of the edge of the connecting body. This may enable the sealing component to be injected with high pressure into a gap or a space between the hollow profile and the connecting body.

In embodiments of the present disclosure, a seal or sealing lip provided inside the opening of the connecting body can suppress the direct contact between the bonding layer and the fluid medium. It is also possible to subsequently coat the bonding layer. The cooling agent used as the coolant may adversely affect the bonding layer and thus impair the function of the same. By sealing or coating the bonding layer, for example a seal or bonding layer disposed between the bonding layer and the cooling agent, the bonding layer can be protected against the cooling agent, and preserving the function of the bonding layer for a longer period.

In embodiments of the present disclosure, the connecting body can be composed of a first part and a second part having interiors fluidically connected to one another. The first part may be bent by an angle in relation to the second part. In principle, all possible angles are conceivable, such as 0°, 45°, 90°, 135° or also 180°. A second opening, which corresponds to the first opening in terms of shape and configuration, can then be present in the second part of the connecting body.

In embodiments of the present disclosure, the angle may be 0°, such that it involves a straight joining piece between two metallic hollow profiles. In the case of 180°, a deflection would be involved, so that the flat sides of the two metallic hollow profiles would extend in parallel.

In embodiments of the present disclosure, the two openings for the metallic hollow profiles in the connecting body are located on top of one another. In this way, the narrow sides of the two metallic hollow profiles would extend in parallel to one another.

In embodiments of the present disclosure, meander-shaped structures could be created from the metallic hollow profiles, which could closely surround larger, complete side walls of elements to be cooled.

In embodiments of the present disclosure, further metallic hollow profiles can be joined to a connecting body. It is then possible for multiple identical openings, or openings that are similar to the first opening, to be present in the connecting body so as to accommodate the metallic hollow profiles. A fluid-tight connection of the further metallic hollow profiles would, as was already described, take place by way of an adhesive, a sealing compound or an injection molding compound, or, in general, by way of a soft component. In this way, the connecting body could also be produced in the form of a T-piece or also as a distributor having more than three connected metallic hollow profiles, which do not all have to have the same size and/or shape. The material of the soft component does not have to be identical for all bonds between the material hollow profiles and the connecting body and it would be possible to combine different sealing compounds, injection molding compounds and adhesives.

In embodiments of the present disclosure, a third opening is present. The third opening may be on a flat side of the connecting body, around which a seal can be disposed on an outer side of the connecting body and which enables a fluid-tight connection to a pipe. The pipe can have at least one flat side. The fluid-tight connection can be achieved by pressing the pipe and the connecting body against one another, wherein the pipe has a pipe opening corresponding to the third opening of the connecting body. The third opening of the connecting body and the corresponding pipe opening overlap.

According to embodiments of the present disclosure, the connecting body may comprise joining elements, which on the side of the third opening on the surface of the connecting body extend away from the same and comprise catch lugs at the end, which can engage in detent edges of the pipe and thereby allow the connecting body and the pipe to be pressed against one another. In this way, a detachable joint between the connecting body and a further hollow profile is possible, which can be easily established by pressing these against one another.

According to embodiments of the present disclosure, the connecting body comprises a seal on an outer side of the connecting body in a sealing profile of the connecting body. The sealing profile can ensure that the seal seated in the sealing profile does not shift. In this way, a fluid-tight joint can be created between the connecting body and the pipe.

According to embodiments of the present disclosure, the connecting body comprises one or more sensors on or in the connecting body. This sensor can be used to measure properties of the fluid present inside the connecting body. Possible sensors include temperature sensors, pressure sensors, flow rate sensors, flow velocity sensors or also sensors that measure the properties of individual components of a fluid mixture, such as concentrations. Since the connecting body is made of non-metallic material, the sensors are automatically isolated with respect to the metallic hollow profiles.

According to embodiments of the present disclosure, further connections can be provided on the connecting body. These can be provided in the form of a hose connector, a quick coupler or a connecting thread. In this way, it is also possible to establish fluid joints of all types to the connecting body (such as a vent line or the like, for example).

According to embodiments of the present disclosure, a flexible connection between a metallic hollow profile and a connecting body for use in cooling applications for electrical components is introduced. The connecting body or the hollow profile has ribs in the joining region so as to implement a defined joining gap. In some embodiments, the surfaces of the joining parts are treated to establish fluid-tight and durable adhesion of the flexible joining component. The durability of the bond can be improved further by an additional coating or shield of the joint site.

According to embodiments of the present disclosure, a production method for a heat exchanger for an electrical component in a motor vehicle is disclosed. Such a method comprises at least the steps of providing, of joining or arranging, and of creating.

According to embodiments of the present disclosure, a metallic extruded profile and a non-metallic connecting body are provided. These may be variants of the extruded profiles and connecting body already described above. In the step of joining, the extruded profile is disposed in relation to the connecting body in such a way that an extruded profile section is disposed inside an accommodating region of the connecting body. The extruded profile section is an end section of the extruded profile having at least one opening toward the at least one cooling channel formed inside the extruded profile. In the step of creating, a bonding layer is created between the extruded profile section and an inner circumferential surface of the accommodating region.

According to embodiments of the present disclosure, the step of creating is carried out after the step of joining, and the bonding layer is injected into the space between the two disposed components. In some embodiments, the bonding layer is first applied, for example molded, onto an outer circumferential surface of the extruded profile section, for example, and in the subsequent step of joining, the components are then disposed with respect to each other so as to create the inventive subject matter.

According to embodiments of the present disclosure, to enhance the adhesive bonding between the extruded profile and the bonding layer and/or between the connecting body and the bonding layer, it is possible in a step of surface treating, prior to the step of creating, and optionally also prior to the step of joining and/or providing, to clean, treat with plasma, etch or coat with a primer at least one of the surfaces in contact with the bonding layer in the assembled state. For example, a nano-coating may be used.

According to embodiments of the present disclosure, a cavity of the heat exchanger, i.e. the area in which the cooling fluid is flowing during usage, may be sealed, for example in the region of the bonding layer, in a step of sealing, to protect the bonding layer. This may take place, for example, by way of painting, swilling out, or immersing in a dip bath. Alternatively or additionally, a seal, for example in the form of a sealing lip, can be provided in the step of providing, and this may be disposed in the step of arranging in such a way that this, in the fully assembled state, keeps the cooling agent away from the bonding layer.

Embodiments of the present disclosure have been described with respect to differing subject matter of the present disclosure. In particular, some embodiments of the present disclosure may be described in connection with device claims, and other embodiments of the present disclosure may be described in connection with method claims.

The described properties of the present disclosure and the manner in which these are achieved will be described in more detail based on the following detailed description. The foregoing general description and the following detailed description are exemplary and explanatory only, and are not restrictive of embodiments consistent with the present disclosure. Further, the accompanying drawings illustrate embodiments of the present disclosure, and together with the description, serve to explain principles of the present disclosure. The accompanying drawings shall only be regarded to be of a schematic, exemplary nature, and not as being true to scale.

DETAILED DESCRIPTION

Figure 1:
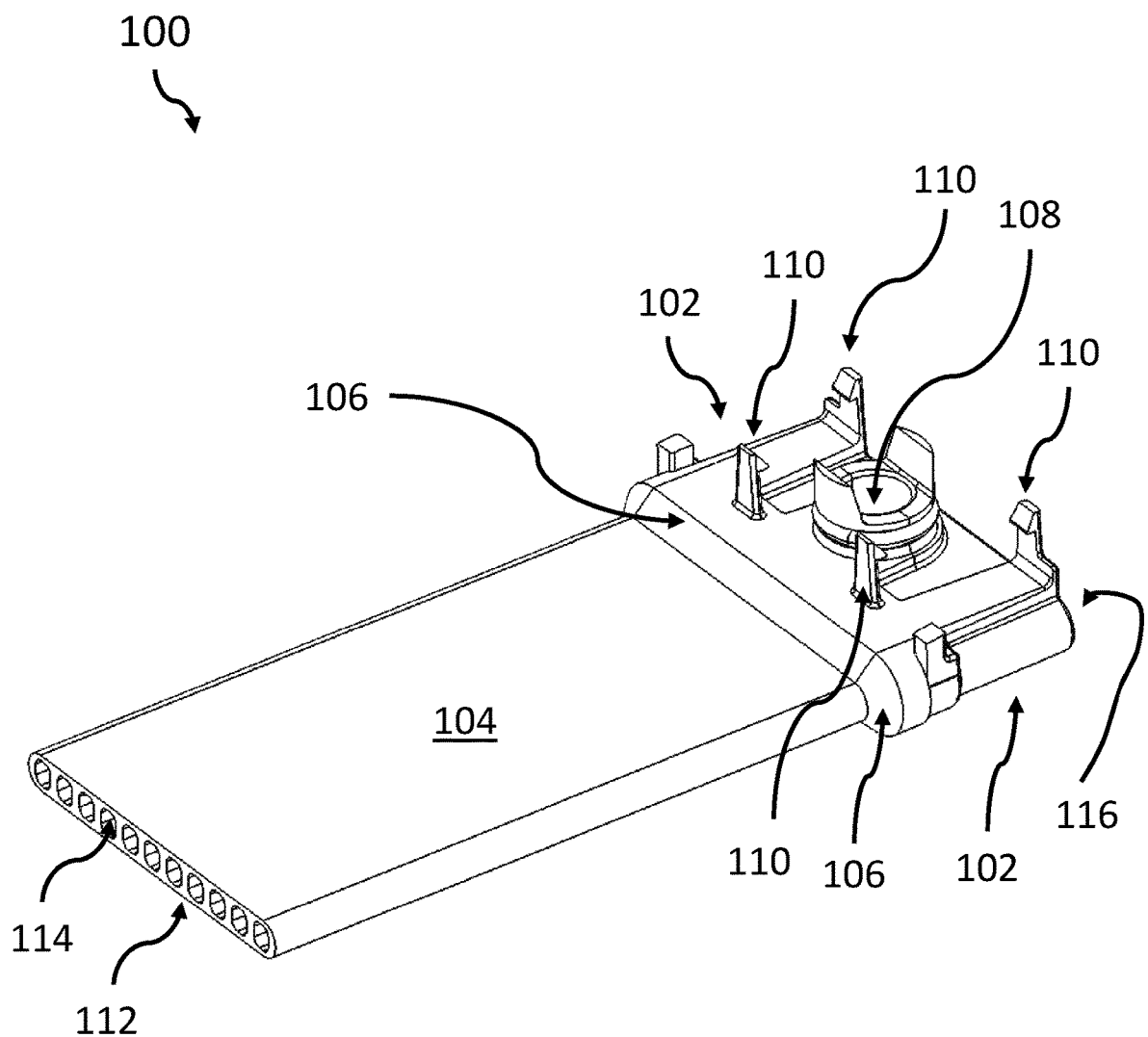
FIG. 1 shows a perspective view of an exemplary connecting body.

Features or components of different embodiments that are identical or at least functionally equivalent to the corresponding features or components of the embodiments are denoted by the same reference numerals or by other reference numerals that differ merely in the first digit from the reference numeral of a (functionally) corresponding feature or a (functionally) corresponding component. So as to avoid unnecessary repetitions, features or components that were already described based on an above-described embodiment are not described again in detail at a later point.

The embodiments described hereafter represent only a limited selection of possible variant embodiments of the present disclosure. In particular, it is possible to suitably combine the features of individual embodiments with one another. For the sake of easier readability and assignability, the description of the figures in part uses reference numerals that are only used in one other figure and make reference to a feature that may perhaps not be visible in the described figure.

The following terms and expressions are used in the present document:

The term "connecting body" describes a hollow body that can be used as an end profile for a fluid-conducting line. It is not necessary for the connecting body and the hollow profile to be made of the same material. The connecting body can also be used to join two or more fluid-conducting conduits. Generally speaking, the connecting body may be used to be connected to an opening of the hollow profile.

The term "hollow profile" can describe an extruded profile. The extruded profile can have a particular profile. For example, it may be a flat pipe, which on the inside has additional cross braces or partitions for directing fluid between an upper wall and a lower wall of the flat pipe. Said hollow profile is preferably made of aluminum or copper, or the alloys thereof. The hollow profile may also be referred to as a fluid-conducting conduit.

The term "bonding layer," "soft component" or "flexible component" may denote an organic or non-organic bond, which is substantially elastic and may be used for sealing purposes. For example, it is possible to use adhesives, sealing compounds, or injection molding compounds. Some of them may be injected into cavities in a hot state and/or under high pressure, for example. Alternatively, as will be described in greater detail hereafter, the bonding layer may be applied to one of the bodies (extruded profile and connecting body) before the two bodies are joined. The bonding layer may comprise rubber-containing and/or silicone-containing materials.

FIG. 1 shows a perspective view of a heat exchanger 100 comprising a connecting body 102 for accommodating a flat metallic hollow profile 104 for use in cooling applications for electrical components. The hollow profile 104 is an extruded profile 104 and has at least one end. The connecting body 102 is hollow inside and composed of a non-metallic material. The connecting body has a first opening (304, see FIG. 3) that corresponds to a cross-section of the one end of the flat metallic hollow profile 104 to be accommodated. The opening is larger than the accommodated end of the flat metallic hollow profile by a distance (202, see FIG. 2) (i.e the periphery of the opening is larger than the accommodated end by a distance). In this way, the hollow profile can be inserted into the first opening of the connecting body 102. Inside, the connecting body 102 comprises a stop in the region of the first opening so that the hollow profile and the connecting body 102 have a defined position in relation to one another.

A bonding layer 106 designed as a soft component fills a space between an outer wall of the flat metallic hollow profile 104 and an inner side of the connecting body 102 in the region of the first opening 304 up to the stop, so that a connection can exist between the inside of the connecting body 102 and the flat metallic hollow profile 104.

The connecting body 102 further includes upwardly extending joining elements 110 (as shown in FIG. 1). In addition, a third opening 108 of the connecting body and the upwardly extending joining elements 110 are apparent in FIG. 1. An inner structure is apparent inside the hollow profile 104, having cross braces 112 extending from the upper face of the hollow profile 104 to the lower face of the hollow profile 104 and being oriented in the longitudinal direction of the hollow profile 104. This yields channels 114 in which the coolant can flow. In this way, a larger contact surface is created for the liquid, whereby better heat transfer can take place from the metallic hollow profile 104 to the coolant. The end face shown on the right in FIG. 1 is referred to as the back side 116 of the connecting body. However, a second opening for accommodating a second hollow profile 104 (not shown) may be present here, which would essentially be laterally reversed to the opening shown on the left on the connecting body.

Figure 2:
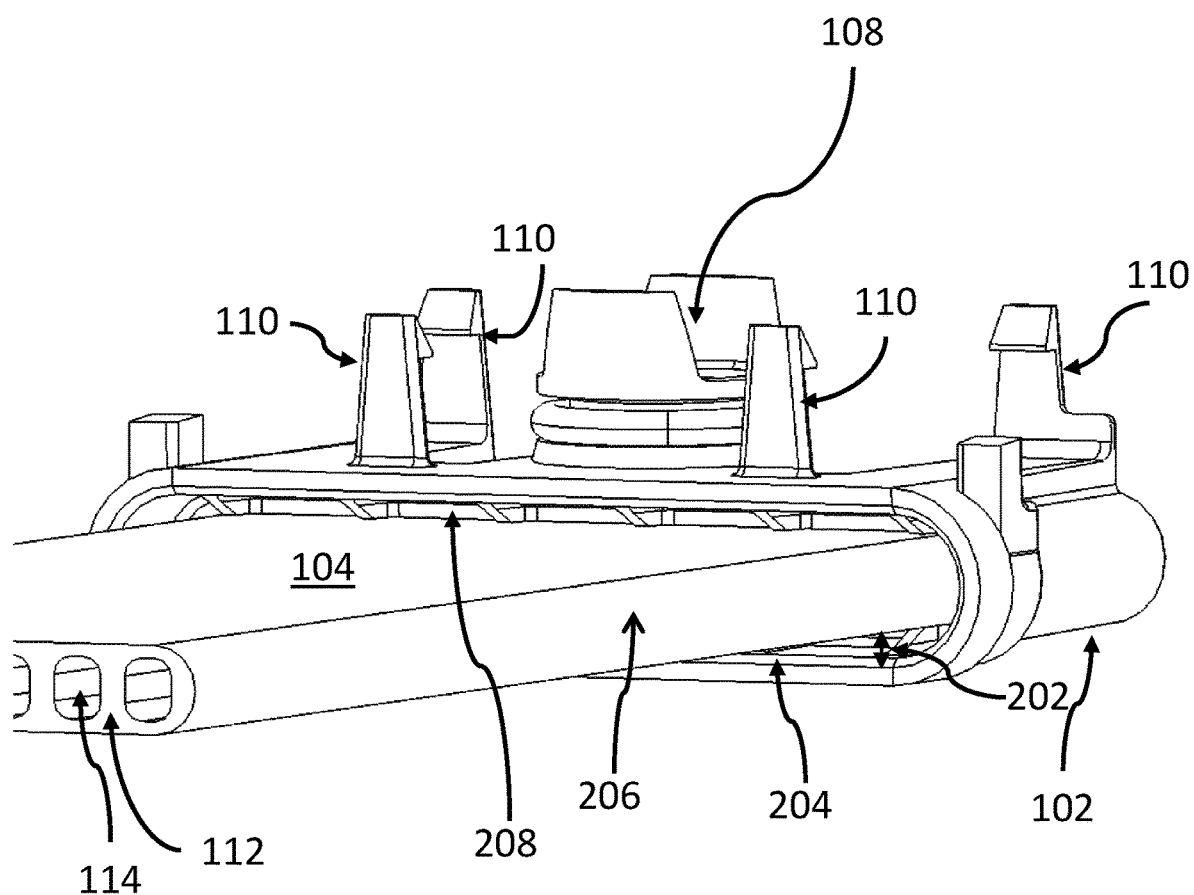
FIG. 2 shows a sectional view of the perspective view of FIG. 1 in which a soft component is missing.

FIG. 2 shows a sectional view of the perspective view of FIG. 1 in which the bonding layer is missing. Instead, the space or the distance 202 between the outer wall of the flat metallic hollow profile 104 and the inner side of the opening of the connecting body 102 is apparent. Between the extruded profile 104 and the connecting body 102, a distance 202 is formed between the wall of the opening 108 of the connecting body 102 and the extruded profile 104. The distance 202 leaves a joining gap 208 open. Furthermore, this perspective view shows the accommodating region 204 of the connecting body 102, which can be accessed via the third opening 108 and is described in greater detail in FIG. 3. The surface of the extruded profile 104 is referred to as the outer circumferential surface 206.

Figure 3:
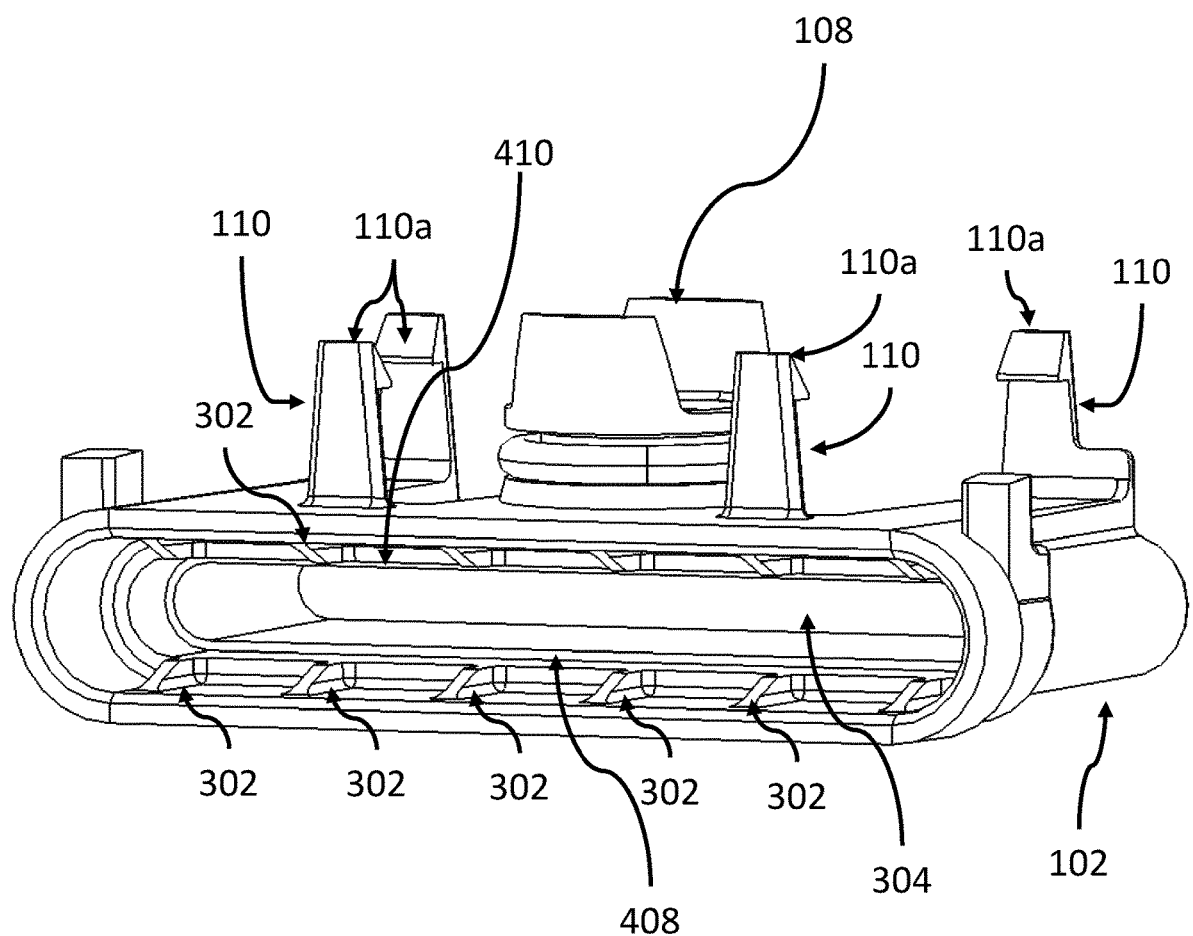
FIG. 3 shows an exemplary connecting body in a perspective view without a hollow profile.

FIG. 3 shows the connecting body 102 in a perspective view without the extruded profile 104. The spacers 302 are now apparent, which are also referred to as guide profiles 302 or ribs 302, and extend inside the first opening 304 up to the stop 408, 410. They can impart more stability to the connecting body 102 in the region of the first opening 304 when the bonding layer in the space between the outer wall of the flat metallic extruded profile 104 and the inner side of the connecting body 102 is filled. The spacers 302 set a minimum distance between the extruded profile 104 and the connecting body 102, whereby a minimum thickness of the bonding layer can be ensured. In this way, it is possible to safely set an elasticity of the bond.

Figure 4:
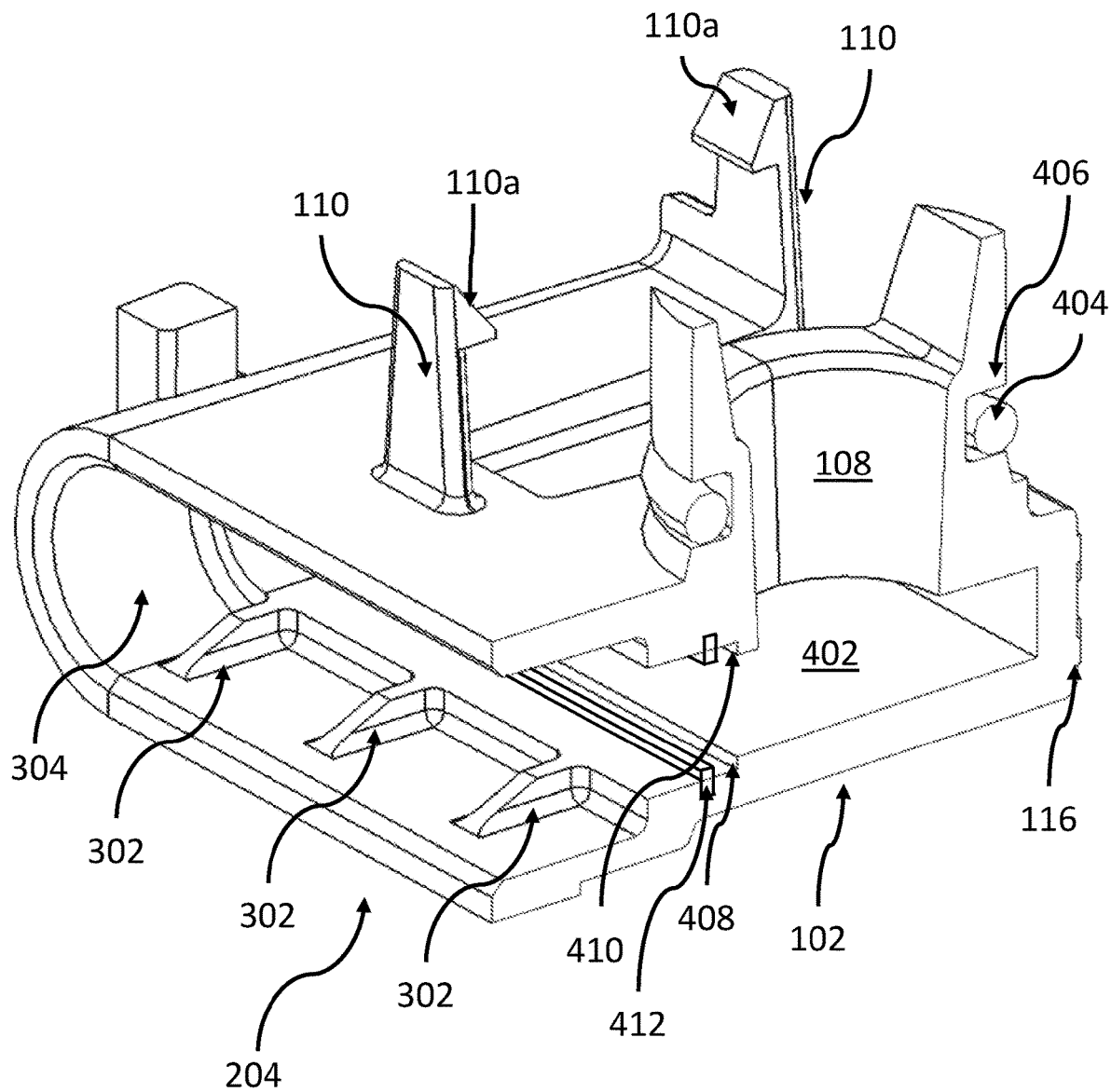
FIG. 4 shows a sectional view of the exemplary connecting body according to FIG. 3.

FIG. 4 shows a sectional view of the connecting body 102 according to FIG. 3. This figure additionally shows the stop 408 up to which the hollow profile 104 can be pushed into the connecting body 102. In addition to the lower stop 408, an upper stop 410 is also shown. The stop 408, 410 can extend around the first opening 304 or comprise only isolated stop protrusions. A peripheral stop can improve sealing between the hollow profile 104 and the connecting body 102. In addition, a seal 412, in the form of a sealing lip 412, is disposed in the first opening 304, extending around the first opening 304. This is configured to keep a cooling agent (not shown) flowing in the heat exchanger 100 away from the bonding layer 106, which is not shown in FIG. 4, since otherwise undesirable chemical reactions could take place between the sealing compound and the bonding layer, which would significantly accelerate undesirable aging of the bonding layer.

Seal 404 is located on an outer side of the connecting body in a sealing profile 416 of the connecting body 102. The sealing profile 416 can ensure that the seal 404 seated in the sealing profile 416 does not shift, so that a fluid-tight joint can be created between the connecting the body 102 and the pipe (see FIG. 6, 602).

The inner space 402 or the interior of the connecting body 102 is now also clearly apparent in FIG. 4. It is also easily apparent here that the connecting body 102 can also include a second opening, which can correspond to the first opening 304 in terms of the design, opposite the first opening (not shown). In this case, the wall at the back side 116 of the connecting body would be removed. Persons skilled in the art would appreciate that a thus created second opening may be bent by an angle in relation to the first opening 304. In this way, it is possible to produce angled joints having arbitrary angles and shapes of hollow profiles 104.

Figure 5:
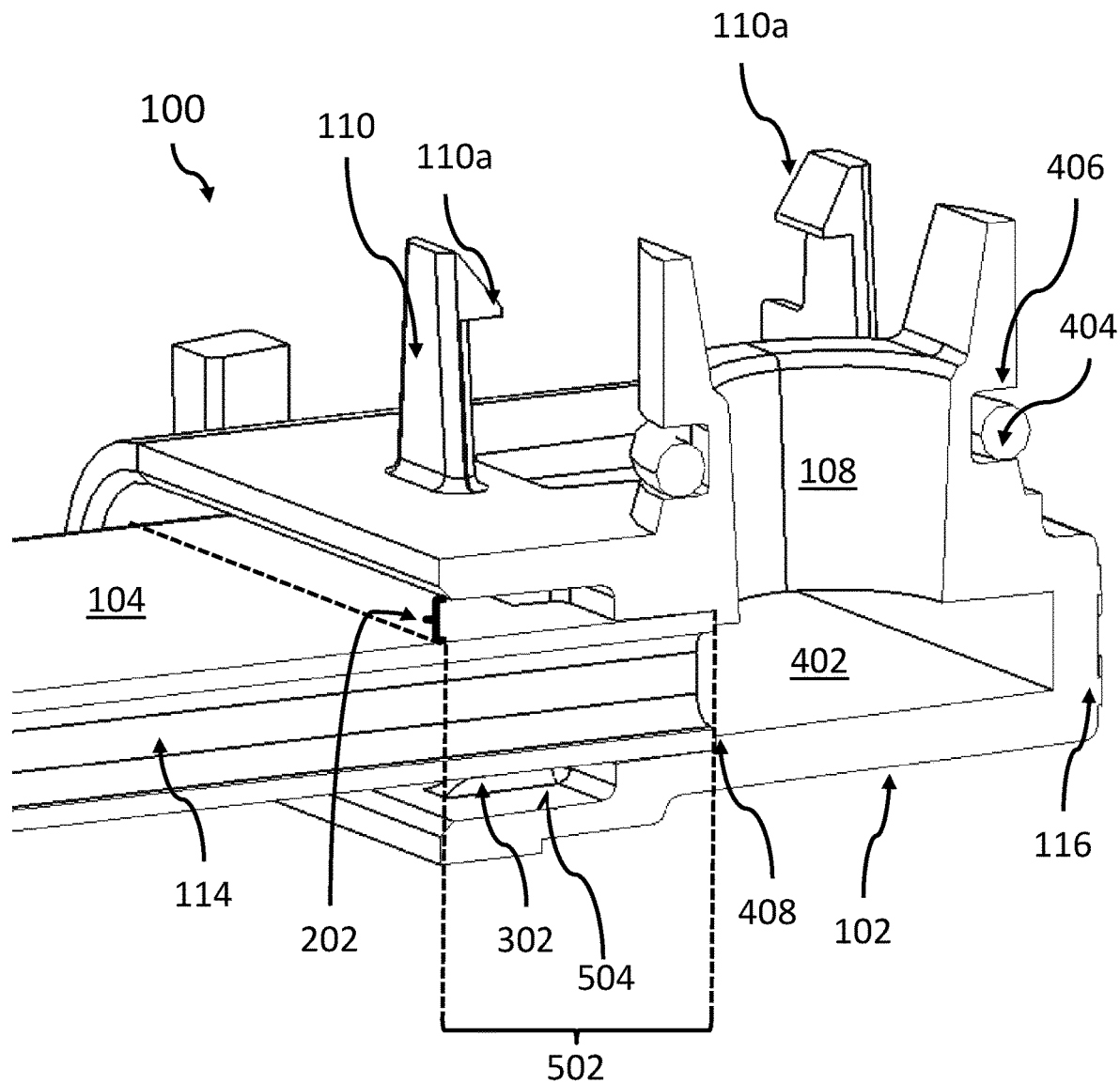
FIG. 5 shows the sectional view of the exemplary connecting body according to FIG. 4 together with the hollow profile.

FIG. 5 shows the sectional view of the connecting body according to FIG. 4 together with the extruded profile 104. It is apparent here that the extruded profile 104 extends to the lower and upper stops 408, 410 of the connecting body 102. The extruded profile 104 is shown in a sectional view through one of the channels 114. In addition, the distance 202 between an outer surface of the extruded profile 104 and an inner side of the connecting body 102 in the region of the first opening 304 is apparent in FIG. 5.

A section of the extruded profile 104 disposed inside the accommodating region 204 may be referred to as the extruded profile section 502. A surface in the accommodating region 204 of the connecting body 102 facing the extruded profile section 502 in the assembled state is referred to as the inner circumferential surface 504.

The joining elements 110 are positioned around the third opening 108. If four joining elements 110 are provided, they may be located at a uniform distance from the center of the third opening 108. The catch lugs 110a essentially point in the direction of the third opening 108, without having to be oriented toward the center of the third opening 108. Rather, the catch lugs 110a are oriented so as engage in detent edges (see FIG. 6, 606) of the pipe (see FIG. 6, 602).

Alternatively, the catch lugs can also be oriented essentially away from the third opening 108 if the detent edges (see FIG. 6, 606) are U-profiles that are recessed so as to be protected and open in the direction of the connecting body 102. In this case, the catch lugs (see FIG. 6, 606) would essentially fix the pipe (see FIG. 6, 602) on the connecting body 102 by way of an insertion of the joining elements 110 comprising the catch lugs 110a, as a result of a non-releasable engagement inside the U-shaped profile, which is located on opposing sides outside the pipe (see FIG. 6, 602). Producing the connecting body 102 from non-metallic material, for example using an injection molding process, provides this kind of flexibility in the configuration.

In some embodiments, it is contemplated to produce two of the joining elements 110 from one piece. In this way, a total of only two joining elements 110 would be present on the connecting body 102; however, these would have a minimum length and be located opposite on opposing sides of the third opening 108, so that the pipe (see FIG. 6, 602) is fixed on the connecting body 102 in a stable manner. Alternatives including a wide joining element on one side of the third opening 108 and two joining elements 110, as shown, on the other side of the third opening 108 are also contemplated. The configuration of these, including the shape and the orientation of the catch lugs 110a, should be implemented in a manner complementary to the configuration of the detent edges (see FIG. 6, 606) of the pipe (see FIG. 6, 606). An embodiment comprising open detent edges (see FIG. 6, 606) on the one side of the pipe and hidden ones (in U-shaped profiles on the pipe, which are downwardly open in the direction of the connecting body 102) on the other side of the pipe is also contemplated.

Figure 6:
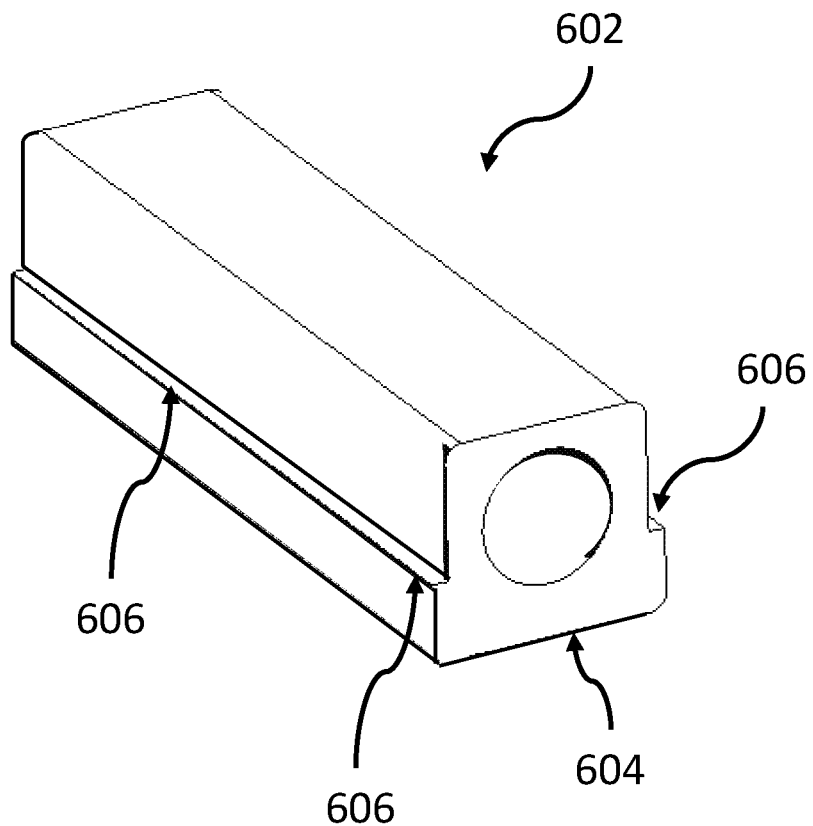
FIG. 6 shows a pipe that may be connected to the exemplary connecting body.

FIG. 6 shows a perspective, cross-sectional view of a pipe 602, which can additionally be connected to the connecting body 102 in a fluid-tight manner. It comprises at least one flat side 604. An opening (not shown), which can correspond to the third opening 108 of the connecting body 102, can be provided in the flat side 604, which is shown at the bottom of FIG. 6, of the pipe 602. When the pipe 602 is fitted between the joining elements 110, the catch lugs 110a of the joining elements 110 of the connecting body 102, if dimensioned appropriately, will engage in the detent edges 606 of the pipe 602 and join the pipe 602 in a fluid-tight manner, by virtue of the seal 404, to the connecting body 102. A person skilled in the art would appreciate that the detent edges 606, for example, can also engage in a hollow profile that is fixedly connected to the pipe and in a correspondingly inside catch lug. Other forms of latching engagements or attachments of the connecting body to/on a pipe are likewise possible.

In some embodiments, at least one more connection option may be present on the connecting body. This allows a further connection, such as in the form of a hose connector, a quick coupler or a connecting thread, or also of sensors. The connecting body thus represents a universal connector to the hollow profile or profiles 104.

Figure 7:
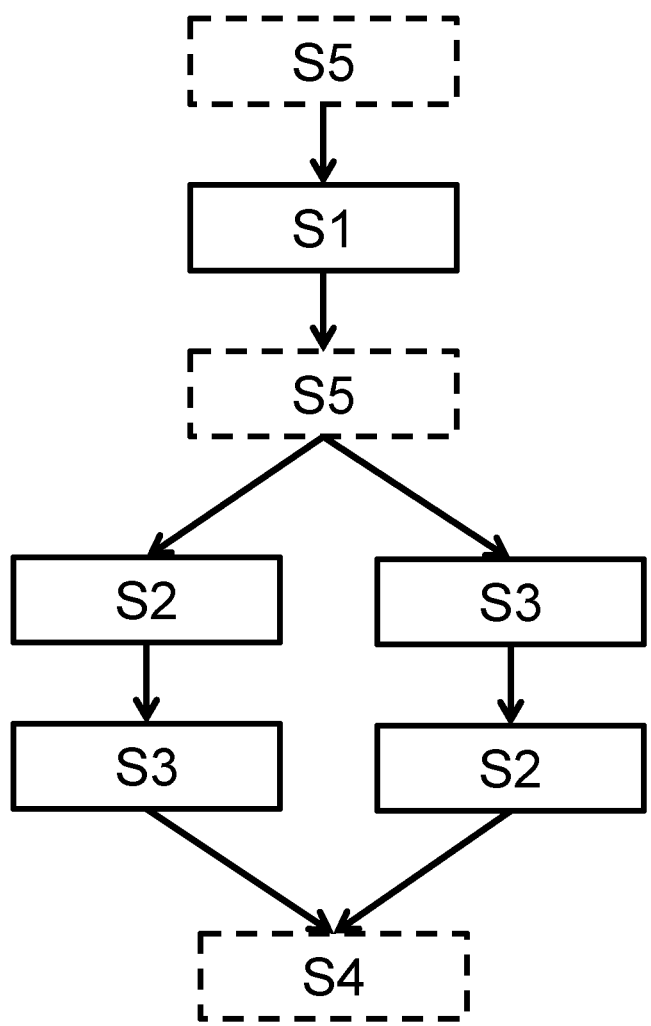
FIG. 7 shows a production method for a heat exchanger according to the present disclosure.

FIG. 7 shows a production method for a heat exchanger according to the present disclosure. The method comprises the following steps:

providing at step S1 at least one metallic extruded profile 104, serving as a heat sink, for a cooling agent to flow through, and at least one non-metallic connecting body 102, which is hollow inside and comprises an accommodating region 204 for the at least one extruded profile 104, wherein the accommodating region 204 has a first opening 304, which corresponds to a cross-section of one end of the flat metallic hollow profile 104 to be accommodated, and wherein the opening 304 peripherally around the metallic extruded profile 104 is larger than the same by a distance 202, wherein at least one stop 408, 410 is formed inside the accommodating region 204 in the region of the first opening 304;

joining at step S2 the extruded profile 104 and the connecting body 102, wherein an extruded profile section 502 is disposed in the accommodating region 204 of the connecting body 102; and creating at step S3 a bonding layer 106, which is disposed between an outer circumferential surface 206 of the extruded profile section 502 and an inner circumferential surface 504 of the accommodating region 204, wherein the bonding layer is designed to establish a mechanically flexible bond between the extruded profile 104 and the connecting body 102.

The step of joining S2 can also be referred to as the step of arranging S2.

Optionally, the steps of providing S1 and of joining S2 may be expanded in such a way that a seal 412 is disposed in the accommodating region 204 between the extruded profile 104 and the connecting body 102 so as to shield the bonding layer 106 against the cooling agent.

In an optional step S4 of sealing, a coating is applied to the bonding layer 106 after the step of creating S3 so as to shield the bonding layer 106 against the cooling agent. The step of sealing S4 may thus also be referred to as a step of coating S4. A cavity of the heat exchanger 100, i.e. the area in which the cooling fluid is flowing within the heat exchanger during usage, is sealed in the step of sealing S4 so as to protect the extruded profile 104, the connecting body 102 and the bonding layer 106 against the cooling agent.

In an optional step of surface treating S5, at least one sub region of the extruded profile section 502 of the extruded profile 104 and/or of the inner circumferential surface 504 of the accommodating region 204 of the connecting body 102 is cleaned and/or treated with a primer and/or etched and/or plasma-treated, so as to enhance the adhesive bonding with the bonding layer 106.

Figure 8:
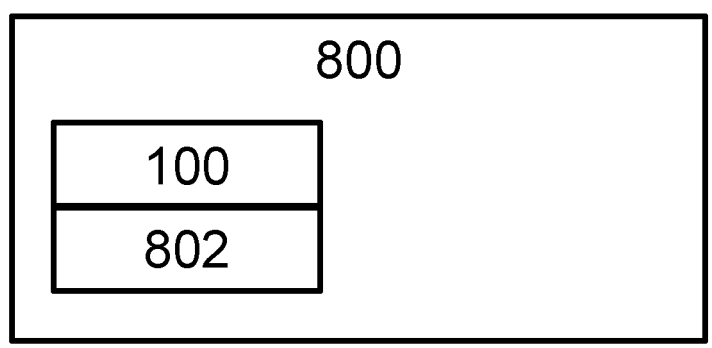
FIG. 8 shows a simplified representation of a motor vehicle comprising a heat exchanger according to the present disclosure.

FIG. 8 shows a simplified representation of a motor vehicle 800 comprising a heat exchanger 100 according to the present disclosure, which is disposed on an electrical component 802. The motor vehicle 100 is in particular a (plug-in) hybrid motor vehicle 800 or an electric vehicle 800. Depending on the exemplary embodiment, the electrical component 802 is, for example. The electrical components 802 are designed in particular for a high-voltage onboard electrical system having more than 400 V or more than 900 V, wherein a particularly high heat input to be cooled is generated.

LIST OF REFERENCE NUMERALS

100 heat exchanger
102 connecting body
104 extruded profile, hollow profile
106 bonding layer, soft component
108 third opening
110 joining element
110a catch lug
112 cross braces in the hollow profile
114 channel in the hollow profile
116 back side of the connecting body
202 distance between the wall of the opening of the connecting body and the hollow profile
204 accommodating region
206 outer circumferential surface
208 joining gap
302 spacer, guide profile, rib
304 first opening
402 interior space of the connecting body
404 seal
406 profile for seal
408 stop, bottom
410 stop, top
412 seal, sealing lip
502 extruded profile section
504 inner circumferential surface
602 pipe
604 flat side of the pipe
606 detent edge
800 motor vehicle
802 electrical component

What is claimed is:

1. A heat exchanger for an electrical component in a motor vehicle, comprising:
   a metallic extruded profile having at least one channel for a cooling agent to flow through, the metallic extruded profile having an outer circumferential surface and a first end;
   a non-metallic connecting body including an accommodating region for receiving the first end of the metallic extruded profile at a first opening corresponding to a cross-section of the first end, the first opening having an inner circumferential surface, a stop arranged on the inner circumferential surface and configured to provide an end point within the first opening when receiving the first end of the metallic extruded profile; and at least one guide profile disposed inside the first opening up to the stop; and
   a bonding layer between the outer circumferential surface of the first end received in the accommodating region and the inner circumferential surface of the opening, wherein the bonding layer is configured to establish a mechanically flexible bond between the metallic extruded profile and the non-metallic connecting body.

2. The heat exchanger according to claim 1, wherein the bonding layer is an adhesive or a thermoplastic elastomer.

3. The heat exchanger according to claim 1, wherein the connecting body is essentially composed of at least one of:
   a thermoplastic polymer including a polyamide (PA) or polybutylene terephthalate (PBT); or
   a fiber reinforced composite material.

4. The heat exchanger according to claim 3, wherein the fiber reinforced composite material comprises one of a carbon fiber reinforced polymer material (CFRP) and a glass fiber reinforced composite material (GFRP).

5. The heat exchanger according to claim 1, further comprising: at least one of a seal or a coating disposed on the bonding layer in the accommodating region so as to shield the bonding layer from the cooling agent.

6. The heat exchanger according to claim 1, wherein the non-metallic connecting body includes a first part having an interior and a second part having an interior, wherein the first part interior is fluidically connected to the second part interior, and the first part is bent by an angle in relation to the second part.

7. The heat exchanger according to claim 6, wherein the first opening has a shape and a configuration, and the second part of the non-metallic connecting body includes a second opening having the same shape and configuration as the first opening, the second opening configured to receive a second metallic extruded profile.

8. The heat exchanger according to claim 6, wherein the non-metallic connecting body has a flat side, and the second part of the connecting body includes:
   a third opening on the flat side of the connecting body;
   a seal surrounding the periphery of the third opening on an outer side region of the connecting body, the seal providing a fluid-tight connection to a pipe when the connecting body and the pipe are pressed against one another, the pipe having a flat side and a pipe opening corresponding to the third opening.

9. The heat exchanger according to claim 8, further comprising: one or more joining elements, the joining elements having a catch lug at an end of the joining element, the catch lug configured to engage with detent edges of the pipe when the connecting body and the pipe are pressed against one another, wherein the joining elements are located on the surface of the connecting body.

10. The heat exchanger according to claim 8, wherein the seal is seated in a sealing profile of the connecting body.

11. The heat exchanger according to claim 1, further comprising: a sensor for measuring properties of a fluid located inside the connecting body.

12. The heat exchanger according to claim 1, wherein the non-metallic connecting body further includes:
   at least one of a hose connector, a quick coupler or a connecting thread.

13. The heat exchanger according to claim 1, wherein the non-metallic connecting body further includes:
   a stop located in the region of the first opening, the stop configured to provide an end point when receiving the first end of the metallic extruded profile.

14. The heat exchanger according to claim 1, wherein the electrical component is a battery, a power distributor, or a switchbox.

15. The heat exchanger according to claim 1, wherein the metallic extruded profile is a flat metallic hollow profile.

16. The heat exchanger according to claim 1 wherein the stop is a peripheral stop arranged at least along one of a top and a bottom of the inner circumferential surface.

\* \* \* \* \*